United States Patent
Bae et al.

(10) Patent No.: US 12,083,546 B2
(45) Date of Patent: Sep. 10, 2024

(54) COATING DEVICE

(71) Applicant: Samsung Display Co., LTD., Yongin-si (KR)

(72) Inventors: Min Ho Bae, Cheonan-si (KR); Hyun Jin Kim, Cheonan-si (KR); Sang Hoon Back, Asan-si (KR); Hae Wook Yang, Asan-si (KR); Yong Hwan Kim, Hwaseong-si (KR); Jong Hyup Kim, Incheon (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/869,593

(22) Filed: Jul. 20, 2022

(65) Prior Publication Data

US 2023/0173524 A1 Jun. 8, 2023

(30) Foreign Application Priority Data

Dec. 2, 2021 (KR) .......................... 10-2021-0170962

(51) Int. Cl.
*B05B 13/02* (2006.01)
(52) U.S. Cl.
CPC ................................ *B05B 13/0242* (2013.01)
(58) Field of Classification Search
USPC ..... 118/52, 612, 319, 320, 500, 56, 57, 712, 118/713
See application file for complete search history.

(56) References Cited

U.S. PATENT DOCUMENTS 5,095,848 A * 3/1992 Ikeno ................ H01L 21/67023
118/54
6,676,757 B2 * 1/2004 Kitano .................... G03F 7/162
118/713

FOREIGN PATENT DOCUMENTS

| KR | 100976702 B1 | 8/2010 |
| KR | 20200081360 A | 7/2020 |
| KR | 20210004193 A | 1/2021 |

* cited by examiner

*Primary Examiner* — Yewebdar T Tadesse
(74) *Attorney, Agent, or Firm* — CANTOR COLBURN LLP

(57) ABSTRACT

A coating device includes: a stage transfer part including a first long shaft extending in a first direction and a second long shaft extending in a second direction intersecting the first direction; a stage tilting part disposed on the stage transfer part, where the stage tiling part swings about a first swing axis; a stage rotating part disposed on the stage tilting part, where the stage rotating part rotates about a first rotating axis intersecting the first swing axis; a stage aligning part disposed on the stage rotating part, where the stage aligning part includes a first short shaft extending in the first direction and a second short shaft extending in the second direction; and a stage disposed on the stage aligning part, wherein a coating target is seated on the stage, where the stage includes a monitoring camera disposed in a camera seating space defined inside the stage.

10 Claims, 24 Drawing Sheets

200: 210, 230
300: 310, 330, 350
310: 310a, 310b, 310c
330: 330a, 330b, 330c
350: 350a, 350b
400: 410, 430

200: 210, 230
300: 310, 330, 350
310: 310a, 310b, 310c
330: 330a, 330b, 330c
350: 350a, 350b
400: 410, 430

200: 210, 230
300: 310, 330, 350
310: 310a, 310b, 310c
330: 330a, 330b, 330c
350: 350a, 350b
400: 410, 430

200: 210, 230
300: 310, 330, 350
310: 310a, 310b, 310c
330: 330a, 330b, 330c
350: 350a, 350b
400: 410, 430

STG: VP, CA, HD, CM

STG1: VP1, CA1, HD1, CM1

200: 210, 230
300: 310, 330, 350
310: 310a, 310b, 310c
330: 330a, 330b, 330c
350: 350a, 350b
400: 410, 430

COATING DEVICE

This application claims priority to Korean Patent Application No. 10-2021-0170962, filed on Dec. 2, 2021, and all the benefits accruing therefrom under 35 U.S.C. § 119, the content of which in its entirety is herein incorporated by reference.

BACKGROUND

1. Field

The disclosure relates to a coating device.

2. Description of the Related Art

Electronic devices such as smart phones, tablet personal computers ("PC"s), digital cameras, notebook computers, navigation systems, and smart televisions that provide images to users include display devices for displaying images.

The importance of the display device is increasing with the development of multimedia. Accordingly, various types of display device such as an organic light emitting display device and a liquid crystal display device are widely used in various fields.

In general, a process of applying droplets such as a cured resin may be performed in a manufacturing process of the display device. Various types of processes such as, for example, a process of forming a hole in a display area, placing a camera in the hole, and then coating droplets to the hole to enlarge the display area of the display device, or a process of coating droplets on an edge of a display device as a filling for protecting a device may be performed.

SUMMARY

Embodiments of the disclosure provide a coating device with improved process characteristics.

According to an embodiment of the disclosure, a coating device includes, a stage transfer part including a first long shaft extending in a first direction and a second long shaft extending in a second direction intersecting the first direction; a stage tilting part disposed on the stage transfer part, where the stage tiling part swings about a first swing axis; a stage rotating part disposed on the stage tilting part, where the stage rotating part rotates about a first rotating axis intersecting the first swing axis; a stage aligning part disposed on the stage rotating part, where the stage aligning part includes a first short shaft extending in the first direction and a second short shaft extending in the second direction; and a stage disposed on the stage aligning part, where a coating target is seated on the stage, and the stage includes a monitoring camera disposed in a camera seating space defined inside the stage.

In an embodiment, the stage transfer part may move the stage aligning part, the stage rotating part, and the stage to a process area in which a nozzle portion is disposed in a first mode, where the nozzle portion may spray a liquid material to the coating target.

In an embodiment, the stage aligning part may align the stage and the coating target with the nozzle portion in a second mode.

In an embodiment, the stage tilting part may swing about the first swing axis to tilt the stage rotating part, the stage aligning part, and the stage in a third mode.

In an embodiment, a width of the first long shaft in the first direction may be greater than a width of the first short shaft in the first direction, and a width of the second long shaft in the second direction may be greater than a width of the second short shaft in the second direction.

In an embodiment, the stage rotating part may rotate the stage aligning part and the stage about the first rotation axis in a fourth mode.

In an embodiment, the first swing axis may be parallel to the first direction, and the first rotation axis may be parallel to a third direction perpendicular to the first direction and the second direction.

In an embodiment, a hole area having a circular shape in a plan view may be defined through the coating target, a center of the hole area overlaps the first rotation axis of the stage rotating part in the second mode, and the liquid material is coated onto the hole area by the nozzle portion in the third mode.

In an embodiment, the monitoring camera may overlap the hole area in the second mode.

In an embodiment, the nozzle portion may coat the liquid material onto an edge of the hole area in the fourth mode.

In an embodiment, the nozzle portion may coat the liquid material on an edge of the coating target in the third mode.

According to an embodiment of the disclosure, a coating device comprises a stage tilting part which swings based on a first swing axis; a stage rotating part disposed on the stage tilting part, where the stage rotates about a first rotation axis intersecting the first swing axis; a stage aligning part disposed on the stage rotating part; and a stage disposed on the stage aligning part, wherein a coating target is seated on the stage, where the stage tilting part surrounds the stage rotating part and the stage aligning part in a U shape.

In an embodiment, the coating device may further include a nozzle portion disposed on the stage, the nozzle portion may spray droplets to the coating target, In an embodiment, the stage aligning part may align the stage and the coating target with the nozzle portion in a first mode.

In an embodiment, the stage rotating part may rotate the stage aligning part, the stage, and the coating target about the first rotation axis in a second mode.

In an embodiment, the first rotation axis may be disposed through the stage.

In an embodiment, the stage tilting part may swing about the first swing axis to tilt the stage rotating part, the first rotation axis, the stage aligning part, the stage, and the coating target in a third mode.

In an embodiment, the stage tilting part may include: a swing portion having a U-shape to surround the stage aligning part and the stage rotating part, a fixing portion spaced apart from the swing portion to surround the swing portion, and a swing member connected to the swing portion and the fixing portion, and the swing member may swing the swing portion by rotating about the first swing axis.

In an embodiment, the coating device may further include a stage transfer part disposed below the stage tilting part, where the stage transfer part may transfer the stage tilting part, the stage rotating part, the stage aligning part, and the stage to a process area in which a nozzle portion is disposed, where the nozzle portion may spray droplets to the coating target.

In an embodiment, the fixing portion of the stage tilting part may be disposed on the stage transfer part and fixed thereto.

In an embodiment, the stage may include a monitoring camera disposed in a camera seating space defined inside the stage.

BRIEF DESCRIPTION OF THE DRAWINGS

The above and other features of the disclosure will become more apparent by describing in detail embodiments thereof with reference to the attached drawings, in which.

DETAILED DESCRIPTION

Figure 1:
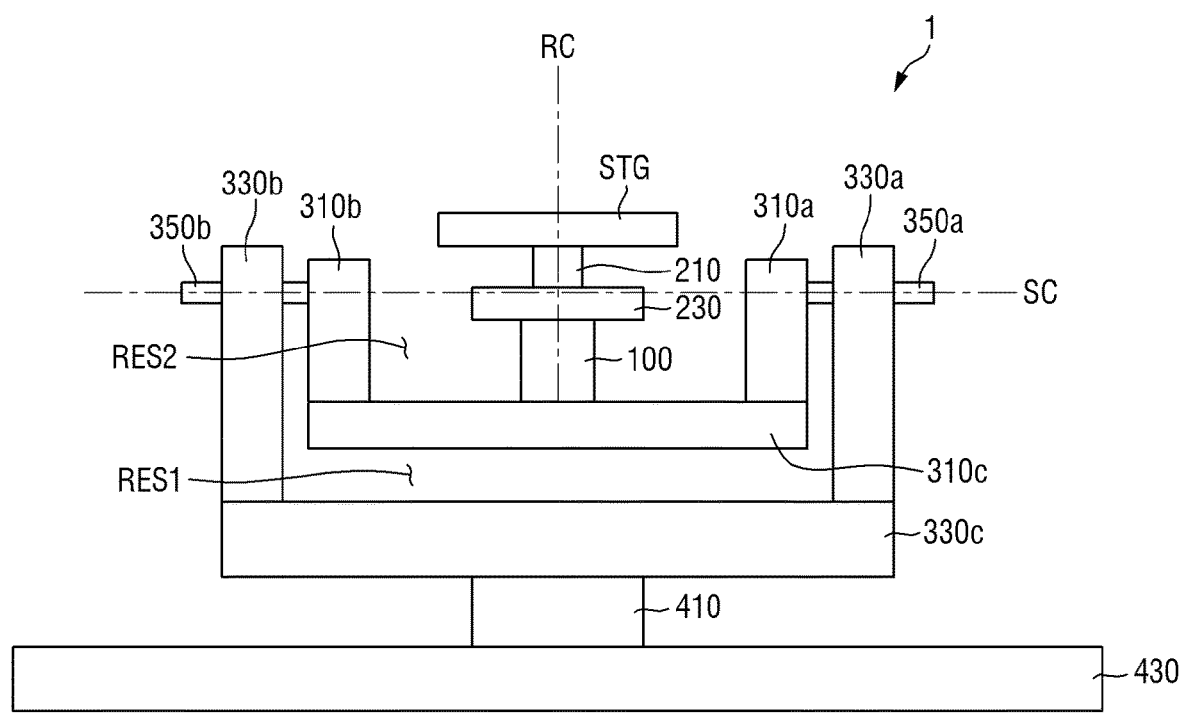
FIG. 1 is a plan view schematically illustrating a coating device according to an embodiment.
Figure 1:
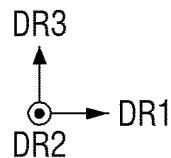

The invention will now be described more fully hereinafter with reference to the accompanying drawings, in which various embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The terms "first", "second", and the like are used to describe various components, but these components are not limited by these terms. These terms are only used to distinguish one component from another. Therefore, a first component mentioned below may be a second component within the technical spirit of the disclosure.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
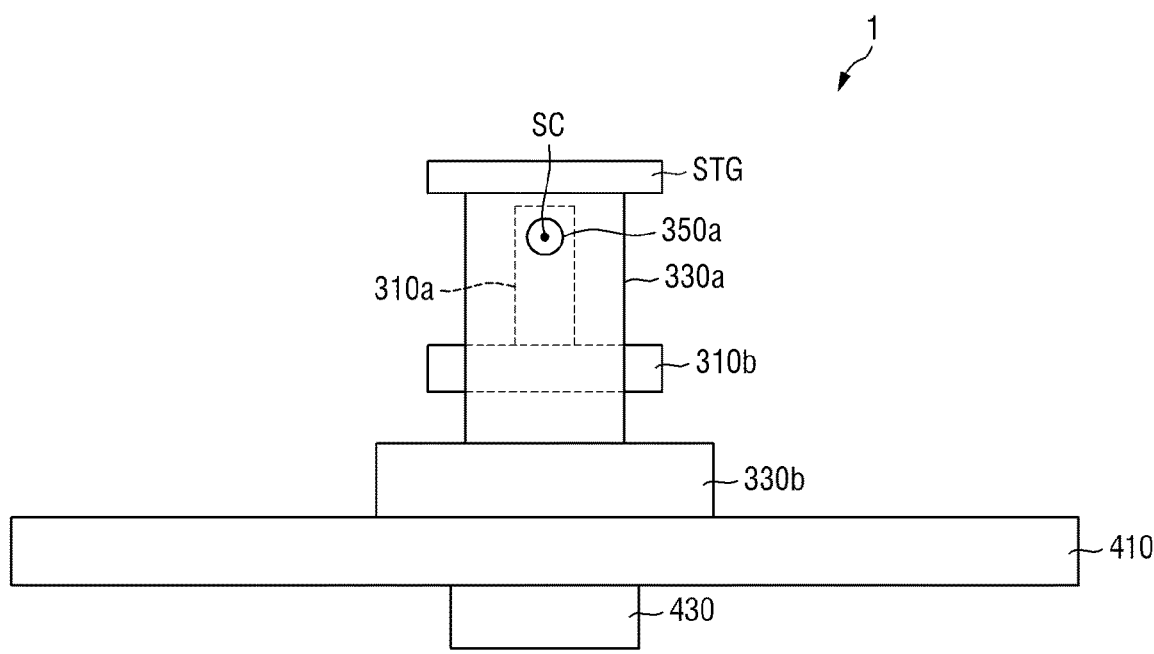
FIG. 2 is a plan view schematically illustrating a side surface of the coating device of FIG. 1.
Figure 3:
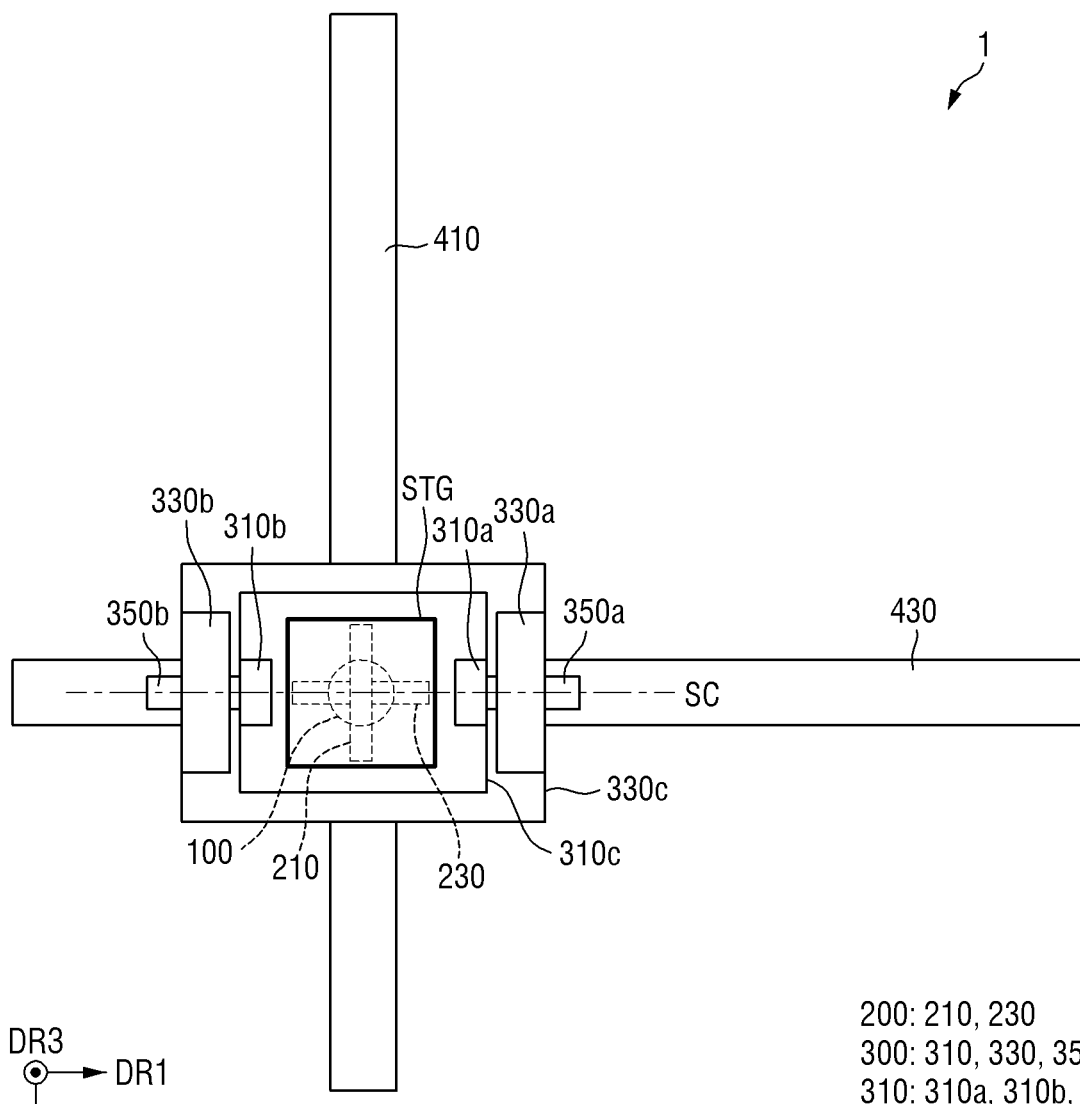
FIG. 3 is a plan view schematically illustrating a shape of the coating device of FIG. 1 as viewed from a third direction.

FIG. 1 is a plan view schematically illustrating a coating device according to an embodiment. FIG. 2 is a plan view schematically illustrating a side surface of the coating device of FIG. 1. FIG. 3 is a plan view schematically illustrating a shape of the coating device of FIG. 1 as viewed from a third direction.

In the specification, unless otherwise specified, the term "direction" may refer to both directions toward both sides extending along the direction. In addition, when both "directions" extending to both sides may be distinguished from each other, one side will be referred to as "one side in the direction" and the other side will be referred to as "the other side in the direction". In FIG. 1, an arrow direction will be referred to as one side, and an opposite direction to the arrow direction will be referred to as the other side. A first direction DR1 and a second direction DR2 may be perpendicular to each other, the first direction DR1 and a third direction DR3 may be perpendicular to each other, and the second direction DR2 and the third direction DR3 may be perpendicular to each other. The third direction DR3 may be a stacking direction of a configuration of a coating device 1 according to an embodiment.

Referring to FIGS. 1 to 3, an embodiment of a coating device 1 may include a stage transfer part 400, a stage tilting part 300, a stage rotating part 100, a stage aligning part 200, and a stage STG in a stacking order.

The stage transfer part 400 may serve to transfer components disposed on the stage transfer part 400. In an embodiment, the stage transfer part 400 may serve to transfer the stage tilting part 300, the stage rotating part 100, the stage aligning part 200, and the stage STG disposed on the stage transfer part 400 to a process area PA (see FIGS. 4 and 5).

The stage transfer part 400 may include an X long shaft 430 extending in a first direction DR1 and a Y long shaft 410 extending in a second direction DR2. The X long shaft 430 may transfer the stage tilting part 300, the stage rotating part 100, the stage aligning part 200, and the stage STG disposed on the stage transfer part 400 in the first direction DR1, and the Y long shaft 410 may transfer the stage tilting part 300, the stage rotating part 100, the stage aligning part 200, and the stage STG disposed on the stage transfer part 400 in the second direction DR2.

In some embodiments, the Y long shaft 410 may be disposed on the X long shaft 430, but the disclosure is not limited thereto. In an alternative embodiment, for example, the X long shaft 430 may be disposed on the Y long shaft 410. Hereinafter, for convenience of description, embodiments in which the Y long shaft 410 is disposed on the X long shaft 430 will be mainly described.

The stage tilting part 300 may perform a swing movement based on a first swing axis SC to tilt components disposed on the stage tilting part 300. In an embodiment, the stage tilting part 300 may serve to tilt the stage rotating part 100, the stage aligning part 200, and the stage STG disposed on the stage tilting part 300. The stage tilting part 300 may be disposed on the stage transfer part 400. The first swing axis SC may be an imaginary straight line parallel to the first direction DR1.

The stage tilting part 300 may include a fixing portion 330, a swing portion 310, and a swing member 350.

The fixing portion 330 of the stage tilting part 300 may serve as a support to allow the swing portion 310 to swing based on the first swing axis SC, as will be described later. The fixing portion 330 may include a support plate portion 330*c*, a first support sidewall 330*a*, and a second support sidewall 330*b*.

The support plate portion 330*c* of the stage tilting part 300 may serve to support the first support sidewall 330*a* and the second support sidewall 330*b*. The support plate portion 330*c* may have a flat plate shape parallel to the first direction DR1 and the second direction DR2. In some embodiments, the support plate portion 330*c* may have a rectangular planar shape, but is not limited thereto. The fixing portion 330 of the stage tilting part 300 may be disposed on the stage transfer part 400 to be fixed to the stage transfer part 400. In some embodiments, the support plate portion 330*c* of the fixing portion 330 of the stage tilting part 300 may be fixed on the Y long shaft 410 of the stage transfer part 400, but is not limited thereto.

The first support sidewall 330*a* and the second support sidewall 330*b* of the stage tilting part 300 may serve to support the swing portion 310 so that the swing portion 310 may swing. The first support sidewall 330*a* may be disposed on one side of the support plate portion 330*c* in the first direction DR1 to have a flat plate shape parallel to a third direction DR3 and the first direction DR1. The second support sidewall 330*b* may be disposed on the other side of the support plate portion 330*c* in the first direction DR1 to have the flat plate shape parallel to the third direction DR3 and the first direction DR1. In some embodiments, a width of the first support sidewall 330*a* in the second direction DR2 and a width of the second support sidewall 330*b* in the second direction DR2 may be smaller than a width of the support plate portion 330*c* in the second direction DR2, but the disclosure is not limited thereto. In an alternative embodiment, for example, the width of the first support sidewall 330*a* in the second direction DR2 and the width of the second support sidewall 330*b* in the second direction DR2 may be substantially the same as the width of the support plate portion 330*c* in the second direction DR2.

As will be described later, a first swing member 350*a* or a second swing member 350*b* may be disposed or extend through each of the first support sidewall 330*a* and the second support sidewall 330*b*. In some embodiments, the first swing member 350*a* may be disposed or extend through the first support sidewall 330*a* in the first direction DR1, and the second swing member 350*b* may be disposed or extend through the second support sidewall 330*b* in the first direction DR1, but the disclosure is not limited thereto.

According to an embodiment as described above, the fixing portion 330 of the stage tilting part 300 may surround the swing portion 310 of the stage tilting part 300 by having a U-shape when viewed from the second direction DR2 as illustrated in FIG. 1. In such an embodiment, the fixing portion 330 may form or define a first accommodation space RES1 in which the swing portion 310 of the stage tilting part 300 is disposed, as a spaced space between the first support sidewall 330*a* and the second support sidewall 330*b* disposed on the support plate portion 330*c*. In such an embodiment, a volume occupied by the coating device 1 may be reduced by the structure described above, such that a size of the coating device 1 may be reduced.

The swing portion 310 of the stage tilting part 300 may serve to tilt components disposed on the swing portion 310 by swinging based on the first swing axis SC. In an embodiment, the swing portion 310 may serve to tilt the stage rotating part 100, the stage aligning part 200, and the stage STG disposed on the swing portion 310. The swing portion 310 may include a swing plate portion 310*c*, a first swing sidewall 310*a*, and a second swing sidewall 310*b*.

The swing plate portion 310*c* of the stage tilting part 300 may serve to accommodate the stage rotating part 100, the stage aligning part 200, and the stage STG, and support the first swing sidewall 310a and the second swing sidewall 310b. The swing plate portion 310c may be disposed to be spaced apart from the support plate portion 330c in the third direction DR3. Accordingly, the swing plate portion 310c is not fixed to the support plate portion 330c, and thus may relatively freely move. The swing plate portion 310c may have a flat plate shape parallel to the first direction DR1 and the second direction DR2. In some embodiments, the swing plate portion 310c may have a rectangular planar shape, but is not limited thereto.

The first swing sidewall 310a and the second swing sidewall 310b of the stage tilting part 300 may serve to transmit power to the swing plate portion 310c to swing the swing plate portion 310c. The first swing sidewall 310a may be disposed on one side of the swing plate portion 310c in the first direction DR1 to have a flat plate shape parallel to the third direction DR3 and the first direction DR1. The second swing sidewall 310b may be disposed on the other side of the swing plate portion 310c in the first direction DR1 to have the flat plate shape parallel to the third direction DR3 and the first direction DR1. In some embodiments, a width of the first swing sidewall 310a in the second direction DR2 and a width of the second swing sidewall 310b in the second direction DR2 may be smaller than a width of the swing plate portion 310c in the second direction DR2, but the disclosure is not limited thereto. In an alternative embodiment, for example, the width of the first swing sidewall 310a in the second direction DR2 and the width of the second swing sidewall 310b in the second direction DR2 may be substantially the same as the width of the swing plate portion 310c in the second direction DR2.

As will be described later, the first swing sidewall 310a and the second swing sidewall 310b may be connected to the first support sidewall 330a and the second support sidewall 330b, respectively, by the first swing member 350a or the second swing member 350b. In such an embodiment, the first swing sidewall 310a may be spaced apart from the first support sidewall 330a in the first direction DR1 with the first swing member 350a interposed therebetween, and the second swing sidewall 310b may be spaced apart from the second support sidewall 330b in the first direction DR1 with the second swing member 350b interposed therebetween.

According to an embodiment as described above, the swing portion 310 of the stage tilting part 300 may surround the stage rotating part 100 and the stage aligning part 200 disposed on the swing portion 310 by having a U-shape when viewed from the second direction DR2 as illustrated in FIG. 1. In such an embodiment, the swing portion 310 may form a second accommodation space RES2 in which the stage rotating part 100, the stage aligning part 200, and the stage STG are disposed, as a spaced space between the first swing sidewall 310a and the second swing sidewall 310b disposed on the swing plate portion 310c. In such an embodiment, a volume occupied by the coating device 1 may be reduced by the structure described above, such that a size of the coating device 1 may be reduced.

The swing member 350 of the stage tilting part 300 may serve to transmit power to the swing portion 310. The swing member 350 may include a first swing member 350a and a second swing member 350b.

The first swing member 350a may be disposed or extend through the first support sidewall 330a and be connected to the first swing sidewall 310a, and may perform a rotational motion about the first swing axis SC. In an embodiment, the first swing sidewall 310a may perform a swing movement by the rotational motion of the first swing member 350a.

The second swing member 350b may be disposed or extend through the second support sidewall 330b and be connected to the second swing sidewall 310b, and may perform a rotational motion about the first swing axis SC. In an embodiment, the second swing sidewall 310b may perform a swing movement by the rotational motion of the second swing member 350b.

The first swing member 350a and the second swing member 350b may be disposed parallel to the first swing axis SC. In some embodiments, the first swing axis SC may be parallel to the first direction DR1, but is not limited thereto. In some embodiments, relative heights at which the first swing member 350a and the second swing member 350b are disposed may be substantially the same as each other, but are not limited thereto. In some embodiments, the first swing member 350a and the second swing member 350b may have a cylindrical shape, but are not limited thereto.

The stage rotating part 100 may serve to rotate the stage aligning part 200 and the stage STG about a first rotation axis RC. In some embodiments, the first rotation axis RC may be parallel to the third direction DR3, but is not limited thereto. The stage rotating part 100 may be disposed on the stage tilting part 300. In an embodiment, the stage rotating part 100 may be disposed on the swing plate portion 310c of the swing portion 310 of the stage tilting part 300.

The stage aligning part 200 may serve to align the stage STG according to the process. The stage aligning part 200 may be disposed on the stage rotating part 100.

The stage aligning part 200 may include an X short shaft 230 extending in the first direction DR1 and a Y short shaft 210 extending in the second direction DR2. The X short shaft 230 may move the stage STG in the first direction DR1. The Y short shaft 210 may move the stage STG in the second direction DR2. A width of the X short shaft 230 of the stage aligning part 200 in the first direction DR1 may be smaller than a width of the X long shaft 430 of the stage transfer part 400 in the first direction DR1, and a width of the Y short shaft 210 of the stage aligning part 200 in the second direction DR2 may be smaller than a width of the Y long shaft 410 of the stage transfer part 400 in the second direction DR2.

In some embodiments, the Y short shaft 210 may be disposed on the X short shaft 230, but the disclosure is not limited thereto. In an embodiment, for example, the X short shaft 230 may be disposed on the Y short shaft 210. Hereinafter, for convenience of description, embodiments in which the Y long shaft 410 is disposed on the X long shaft 430 will be mainly described.

The stage STG may serve to seat a coating target. In such an embodiment, the coating target may be seated on the stage STG, and a coating process in which a liquid material sprayed from a nozzle portion NZ, which will be described later, is coated may be performed. The stage STG may be disposed on the stage aligning part 200.

In such an embodiment, as described above, the coating device 1 may easily respond to various coating methods, and thus process efficiency may be increased. Hereinafter, the movement of the coating device 1 according to an embodiment will be described in detail.

Figure 4:
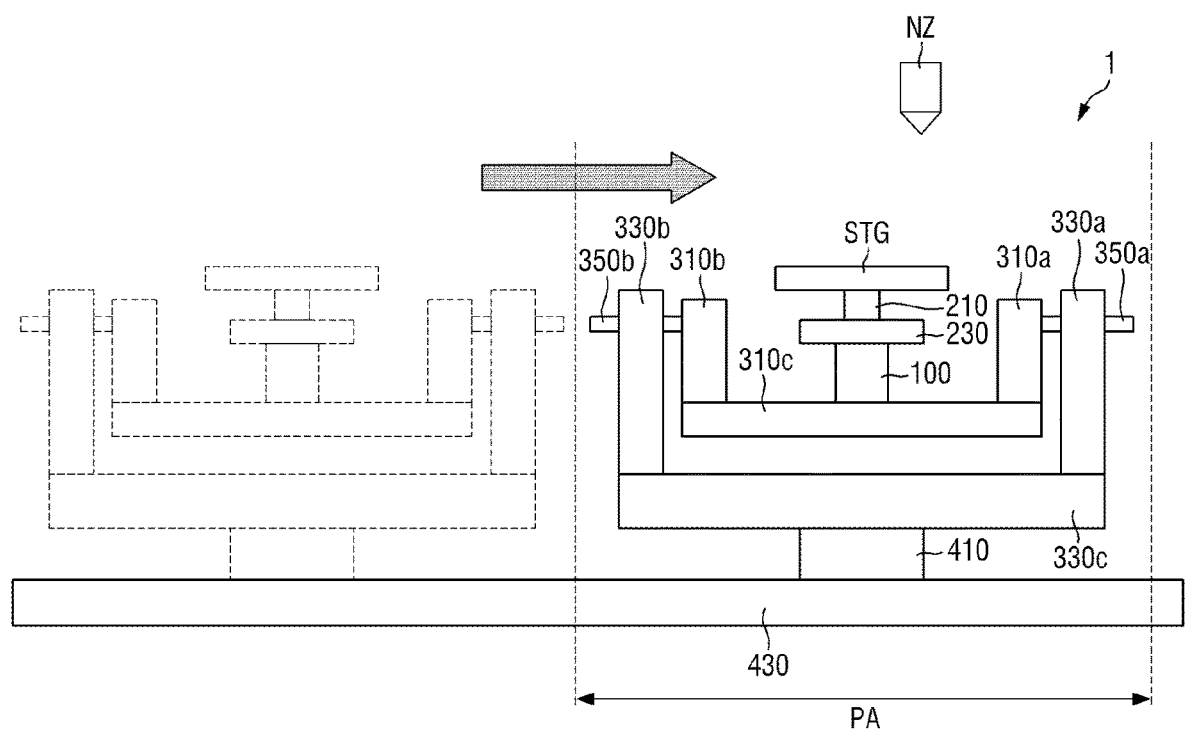
FIGS. 4 and 5 are plan views schematically illustrating a movement of the coating device in a first mode according to an embodiment.
Figure 4:
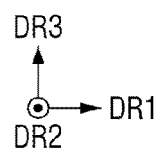
Figure 5:
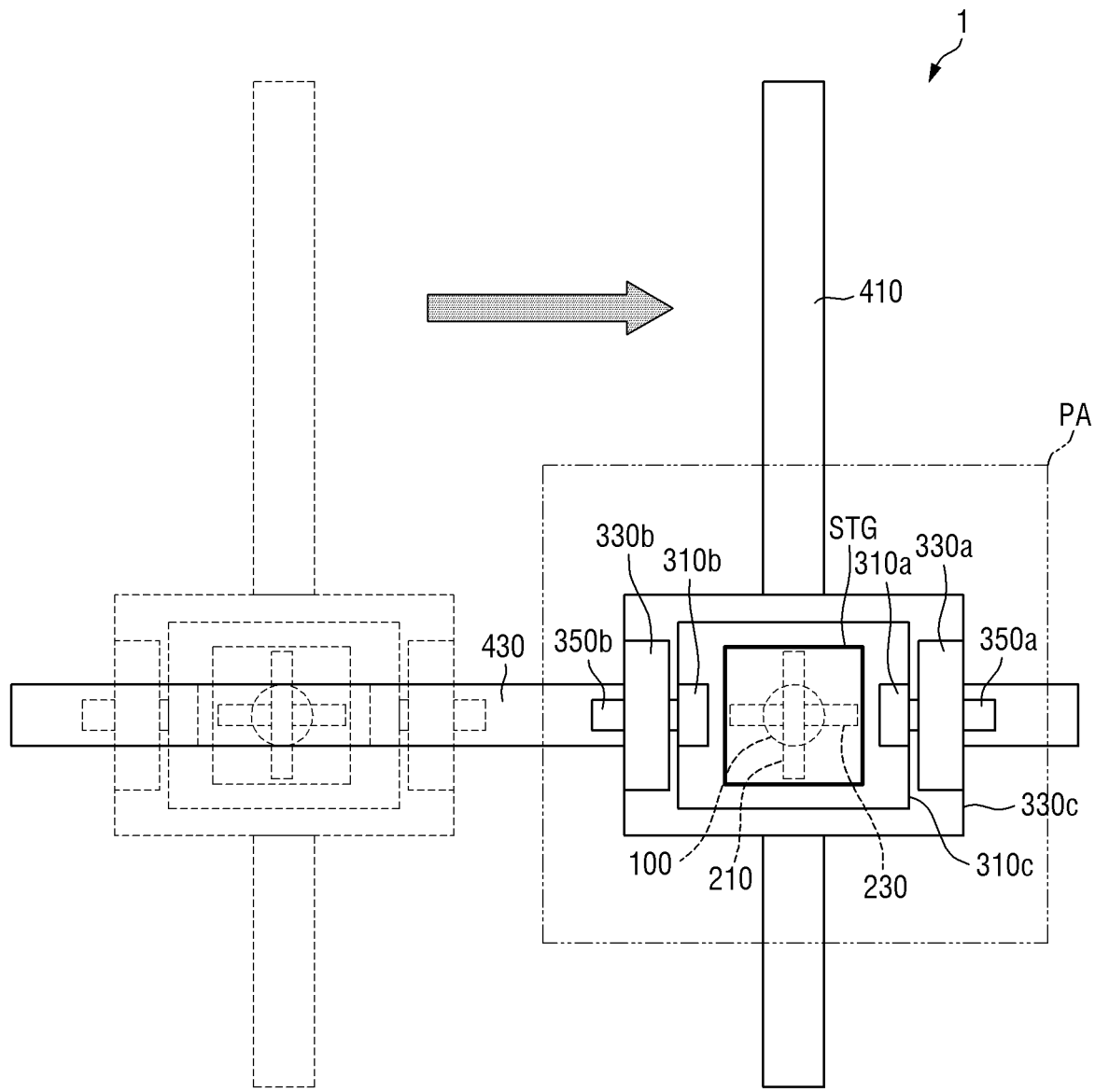
Figure 6:
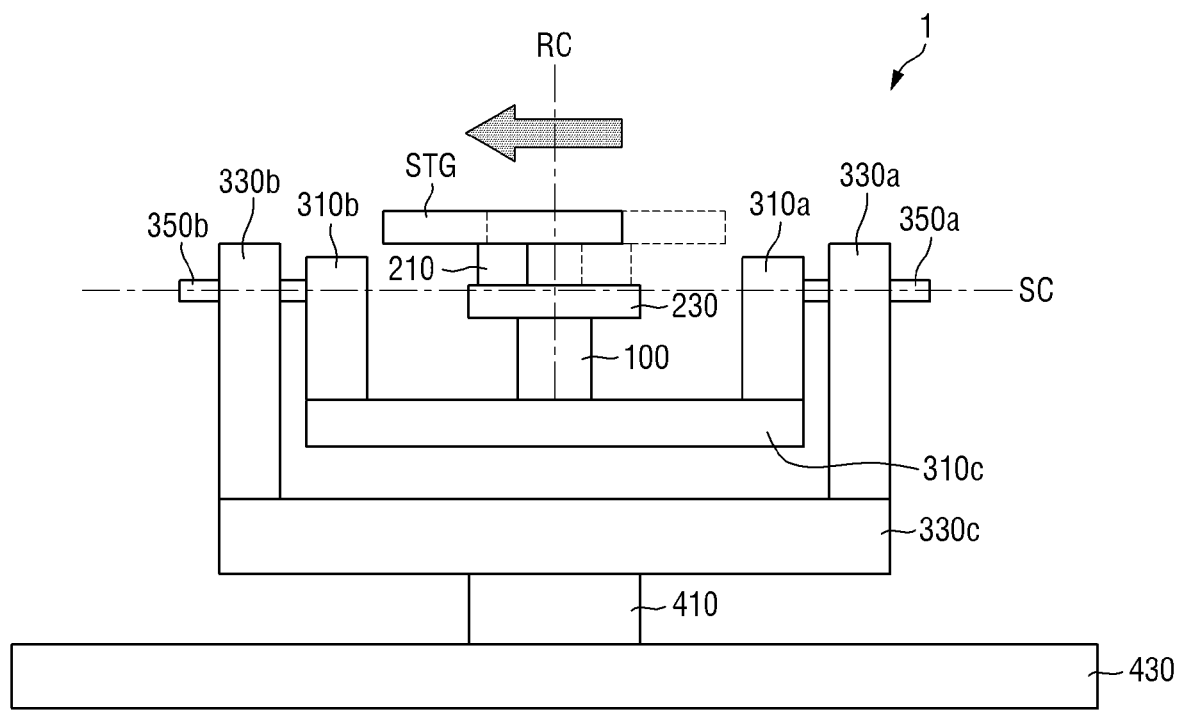
FIGS. 6 and 7 are plan views schematically illustrating a movement of the coating device in a second mode according to an embodiment.
Figure 7:
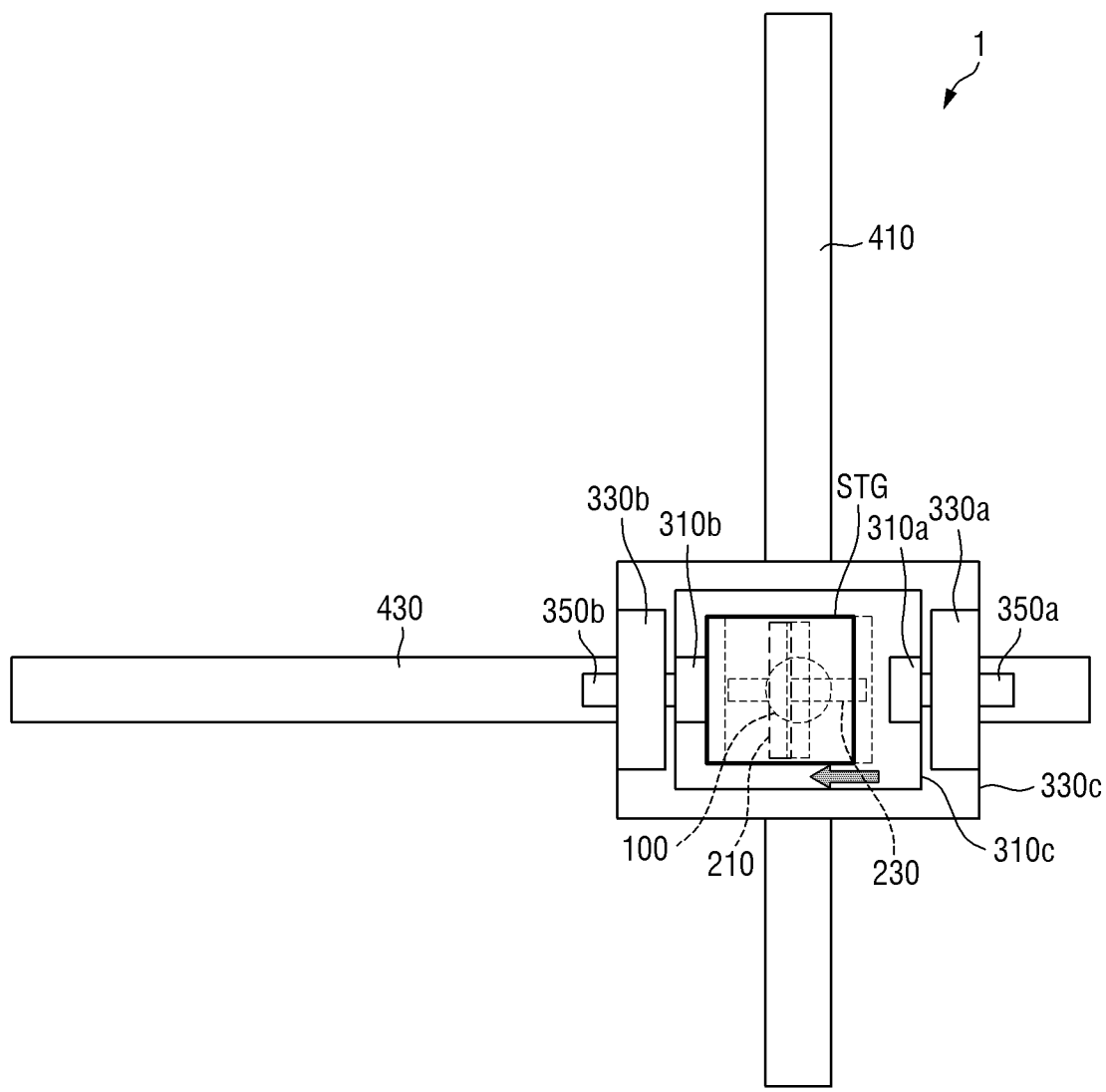
Figure 7:
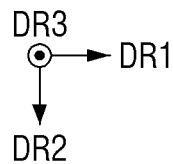
Figure 8:
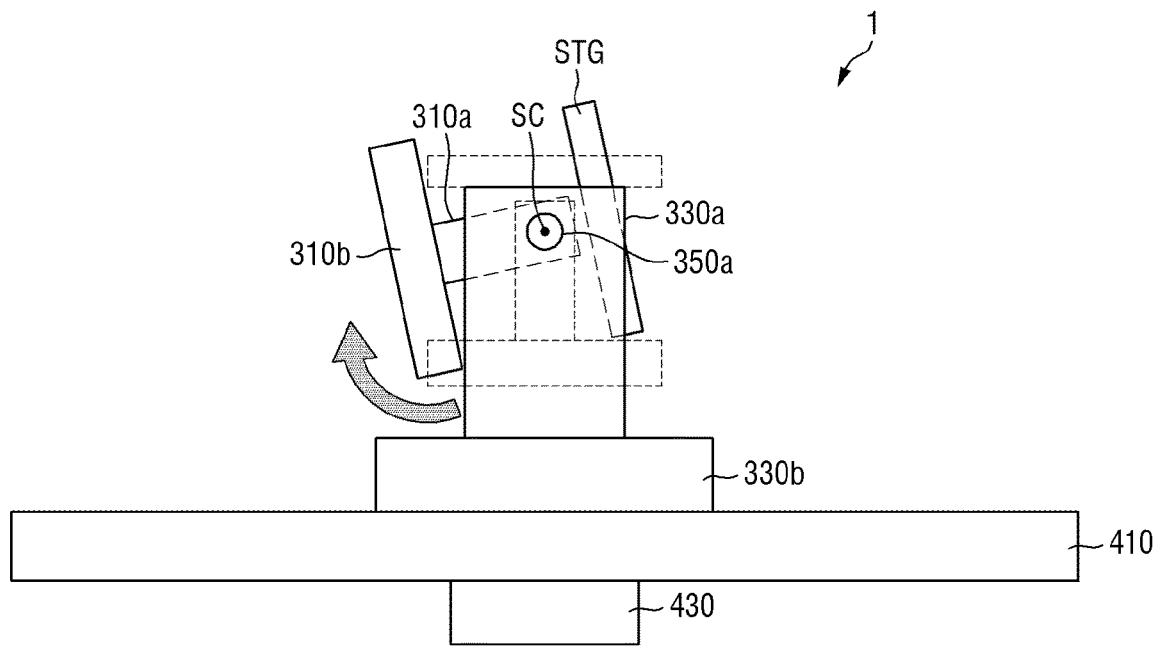
FIG. 8 is a plan view schematically illustrating a movement of the coating device in a third mode according to an embodiment.

FIGS. 4 and 5 are plan views schematically illustrating a movement of the coating device in a first mode according to an embodiment. FIGS. 6 and 7 are plan views schematically illustrating a movement of the coating device in a second mode according to an embodiment. FIG. 8 is a plan view schematically illustrating a movement of the coating device in a third mode according to an embodiment.

Referring to FIGS. 4 and 5, an embodiment of the coating device 1 may be driven in a first mode in which the stage transfer part 400 transfers or leaves the stage tilting part 300, the stage rotating part 100, the stage aligning part 200, and the stage STG on the stage transfer part 400 to and from a process area PA. in an embodiment, the coating device 1 may include different process areas PA in which different processes are performed, and the stage transfer part 400 may perform various processes by transferring the stage tilting part 300, the stage rotating part 100, the stage aligning part 200, and the stage STG on the stage transfer part 400 to the process area PA to be performed. Hereinafter, the process area PA refers to an area in which a coating process is performed.

Figure 15:
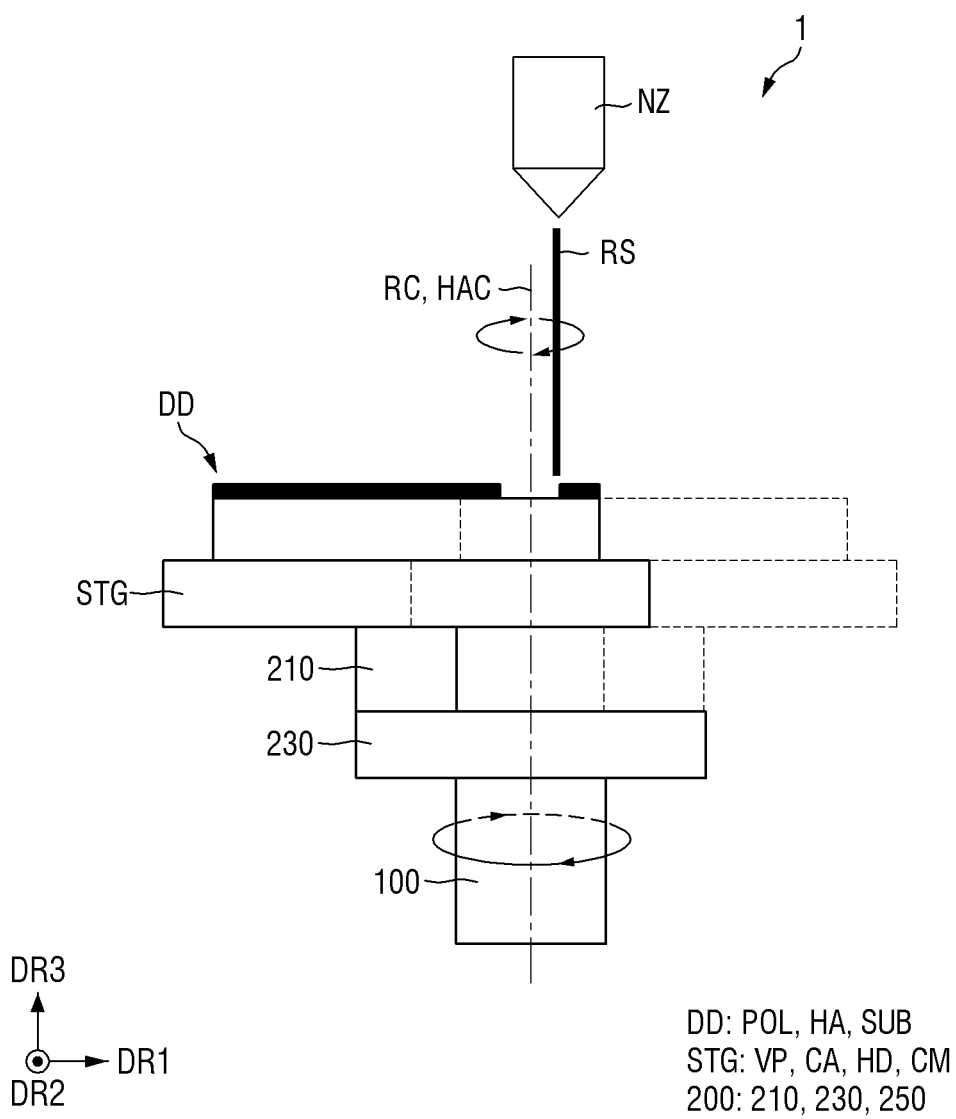
Figure 16:
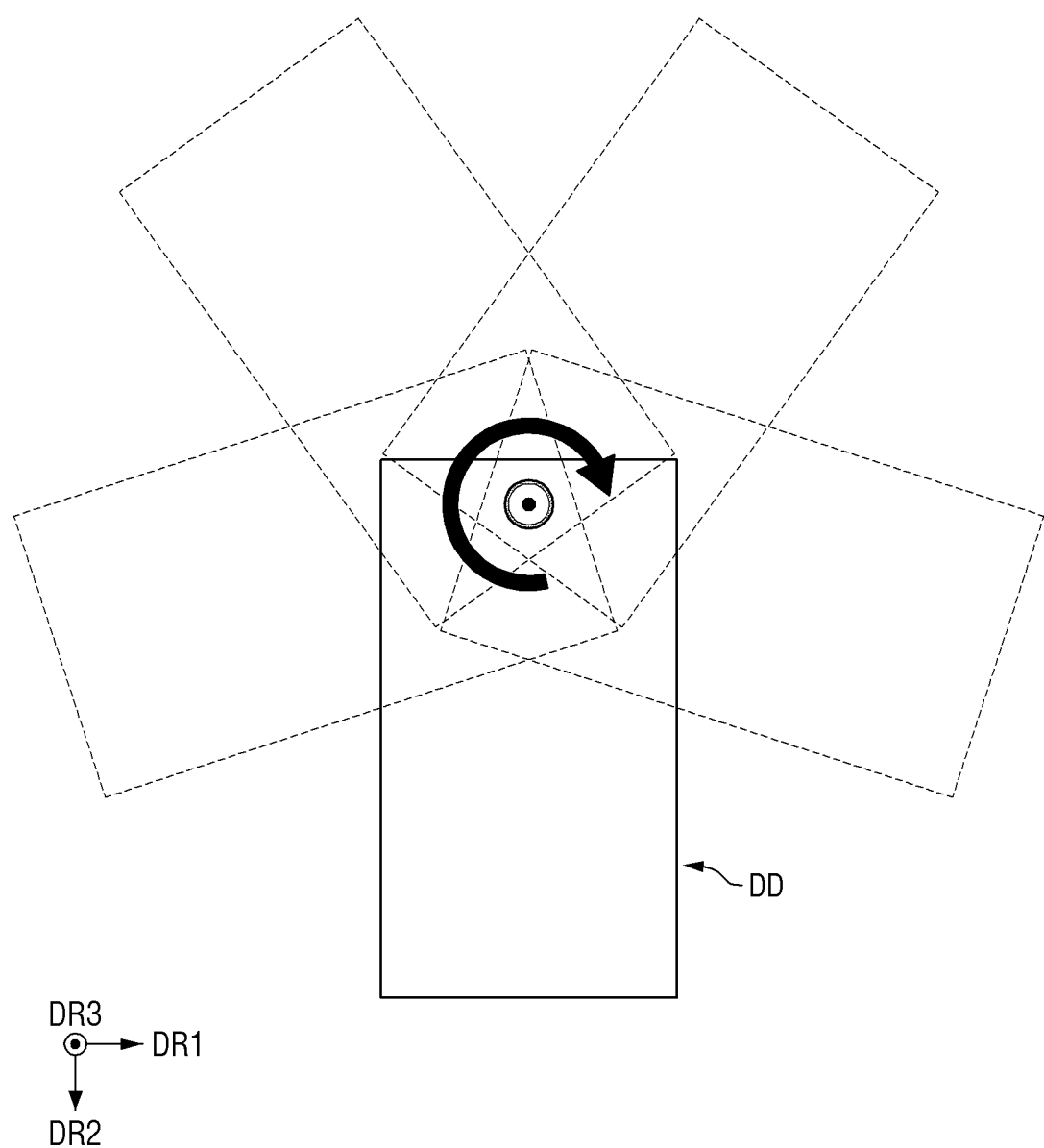
Figure 17:
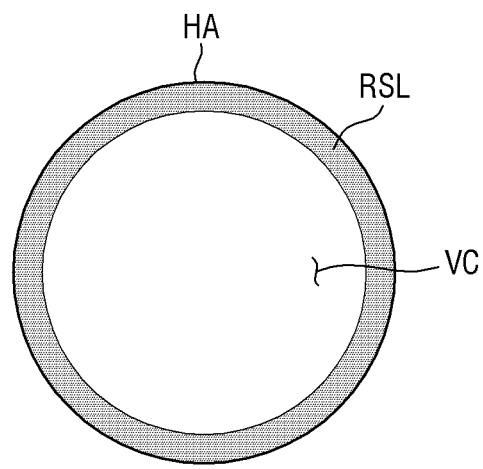
Figure 17:
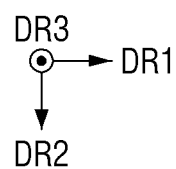

In an embodiment, the coating device 1 may further include a nozzle portion NZ in the process area PA. The nozzle portion NZ may serve to perform the coating process by spraying a liquid material such as a cured resin RS (shown in FIGS. 15 and 19) to the coating target. In such an embodiment, the coating device 1 may allow the coating process to be performed by transferring the stage tilting part 300, the stage rotating part 100, the stage aligning part 200, and the stage STG on the stage transfer part 400 to the process area PA as the first mode.

In some embodiments, when the X long shaft 430 transfers the stage tilting part 300, the stage rotating part 100, the stage aligning part 200, and the stage STG on the stage transfer part 400 in the first direction DR, the Y long shaft 410 may also be transferred in the first direction DR1, but is not limited thereto.

Referring to FIGS. 6 and 7, an embodiment of the coating device 1 may be driven in a second mode in which the stage aligning part 200 aligns the stage STG with the nozzle portion NZ on the process area PA. In some embodiments, when the X short shaft 230 aligns the stage STG in the first direction DR1, the Y short shaft 210 may also be aligned in the first direction DR1, but is limited thereto. Detailed features of a process in which the stage aligning part 200 aligns the stage STG with the nozzle portion NZ in the second mode will be described later.

Referring to FIG. 8, an embodiment of the coating device 1 may be driven in a third mode in which the first swing member 350a and the second swing member 350b rotate about the first swing axis to tilt the swing portion 310 of the stage tilting part 300, the stage aligning part 200, and the stage STG.

In the third mode, the first support sidewall 330a and the second support sidewall 330b may intersect the first swing sidewall 310a and the second swing sidewall 310b. In an embodiment, in the third mode, the first support sidewall 330a and the second support sidewall 330b may be fixed, and the first swing sidewall 310a and the second swing sidewall 310b may be tilted to intersect each other. In some embodiments, the swing portion 310 of the stage tilting part 300, the stage aligning part 200, and the stage STG may be tilted clockwise based on the first swing axis SC, but are not limited thereto. In an alternative embodiment, for example, the swing portion 310 of the stage tilting part 300, the stage aligning part 200, and the stage STG may be tilted counterclockwise based on the first swing axis SC.

In the third mode, an embodiment of the coating device 1 may be driven to maintain a state in which the swing portion 310 of the stage tilting part 300, the stage aligning part 200, and the stage STG are tilted based on the first swing axis SC.

In the first mode, the second mode, and the third mode may each be independently driven.

Hereinafter, a process in which the coating device 1 according to an embodiment aligns the coating target seated on the stage STG with the nozzle portion NZ, and coats a liquid material onto the coating target will be described in detail.

Figure 9:
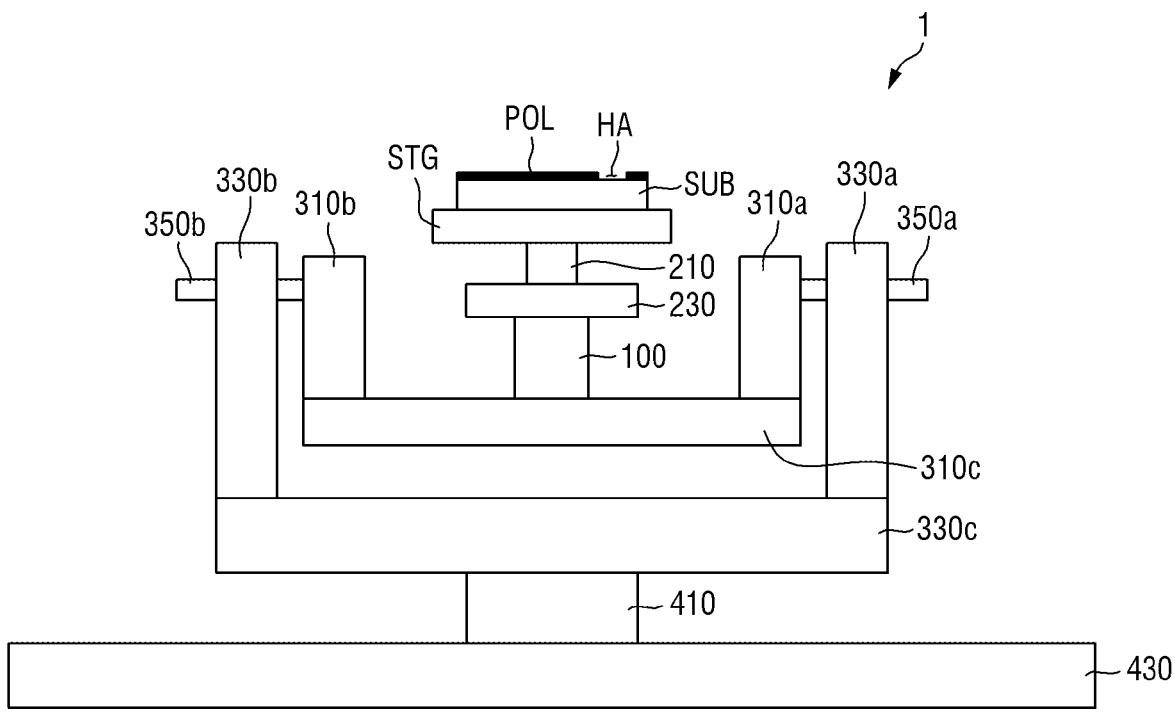
FIGS. 9 to 11 are plan views schematically illustrating a process of seating a display device on a stage of the coating device and aligning the display device with a nozzle portion according to an embodiment.
Figure 10:
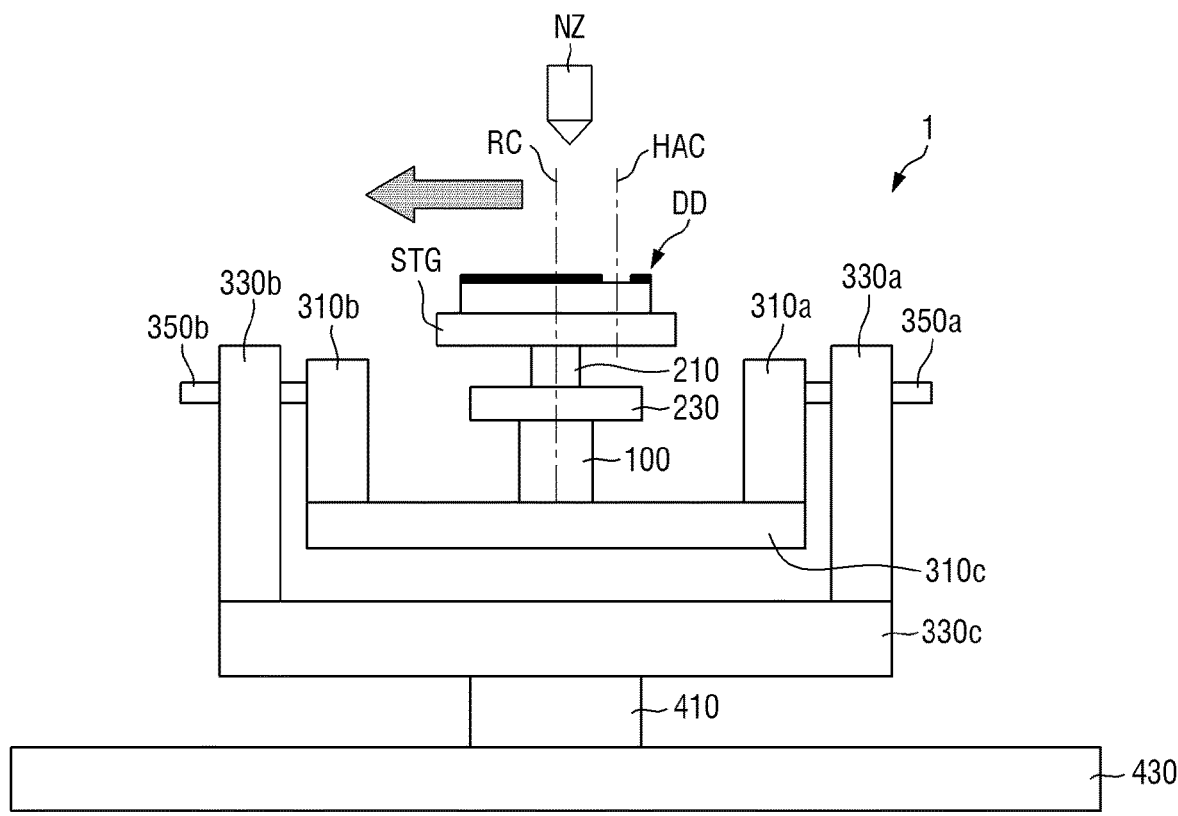
Figure 11:
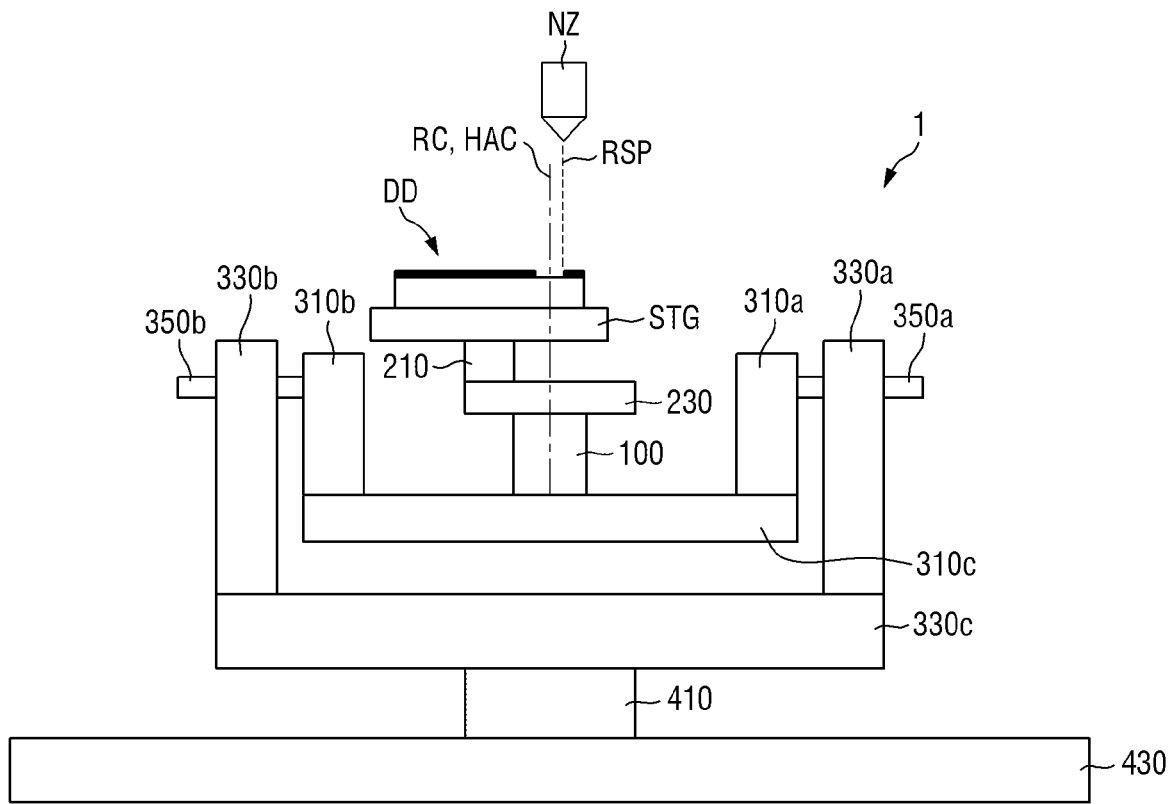
Figure 11:
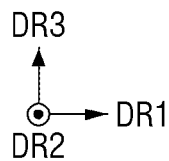
Figure 12:
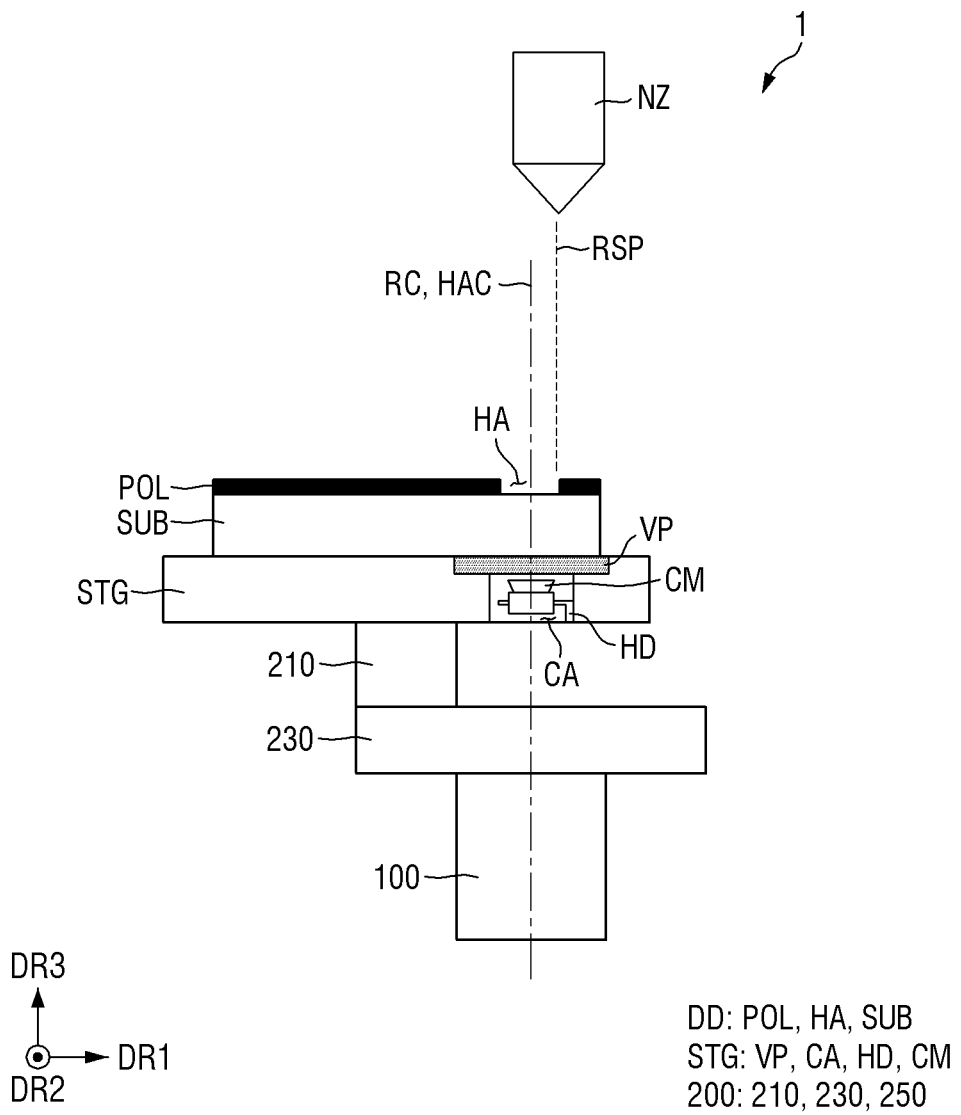
FIG. 12 is a plan view schematically illustrating a state in which the display device and the nozzle portion are aligned.
Figure 13:
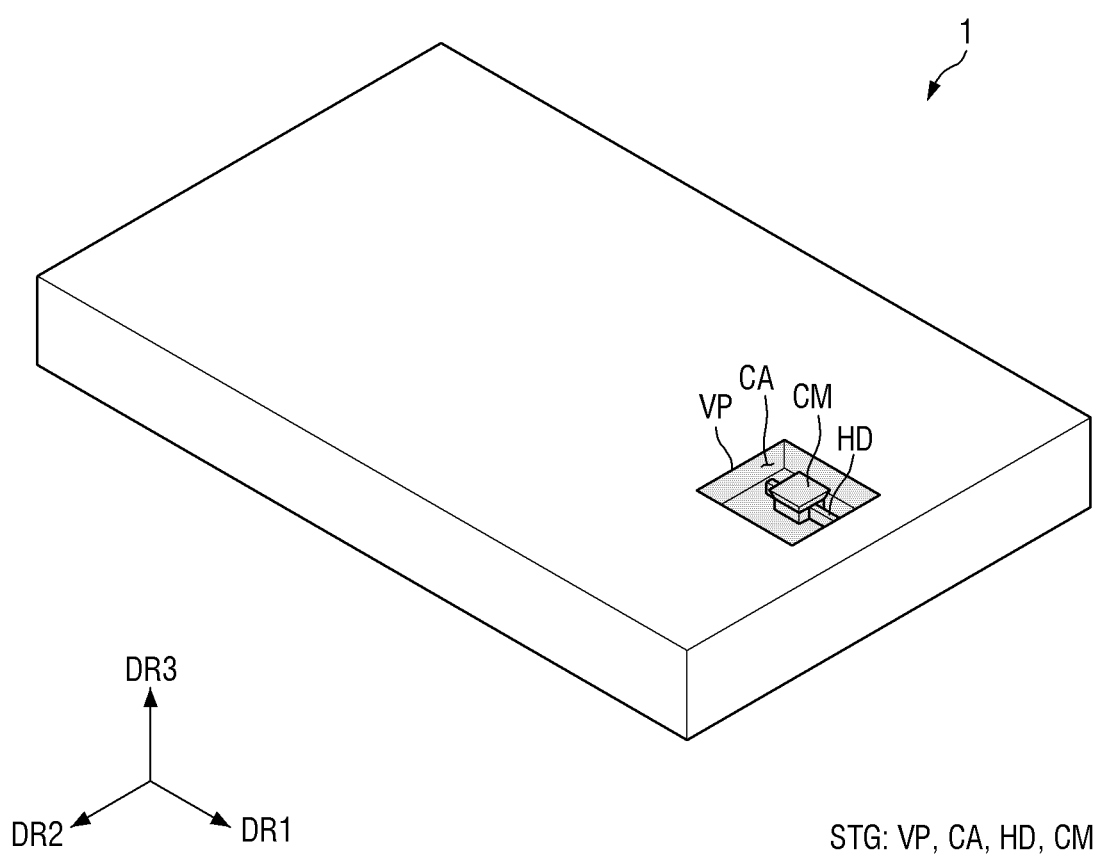
FIG. 13 is a perspective view schematically illustrating the stage of FIG. 12.
Figure 14:
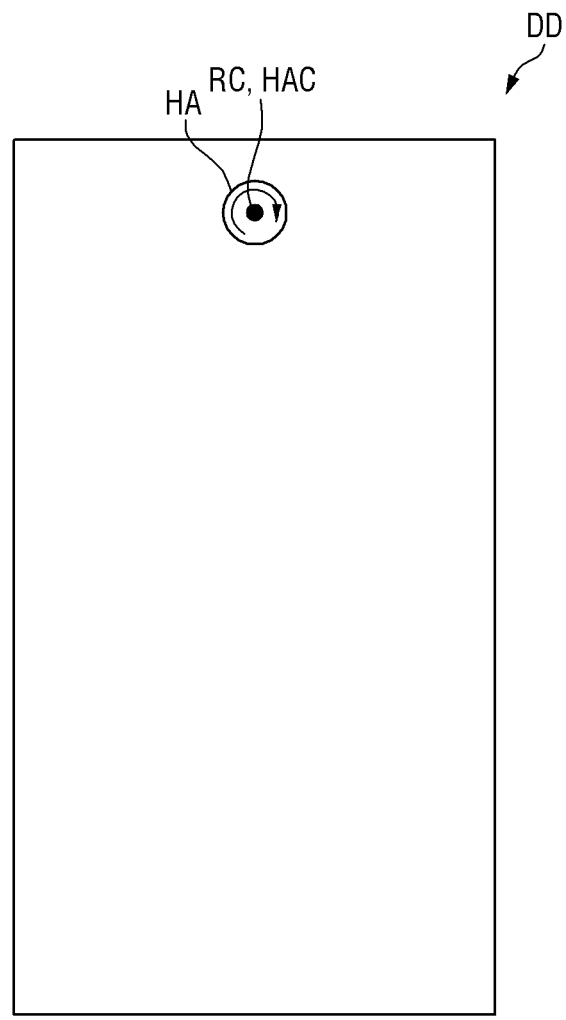
FIGS. 14 to 17 are views schematically illustrating an embodiment of a process of coating a liquid material on a display device by the coating device.
Figure 14:
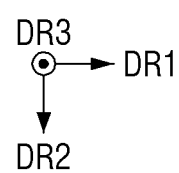

FIGS. 9 to 11 are plan views schematically illustrating a process of seating a display device on a stage of the coating device and aligning the display device with a nozzle portion according to an embodiment. FIG. 12 is a plan view schematically illustrating a state in which the display device and the nozzle portion are aligned. FIG. 13 is a perspective view schematically illustrating the stage of FIG. 12. FIGS. 14 to 17 are views schematically illustrating an embodiment of a process of coating a liquid material on a display device by the coating device.

Referring to FIGS. 9 to 11, in an embodiment, the coating target may be seated on the stage STG. In some embodiments, the coating target seated on the stage STG may be a display device DD, e.g., a display device DD in which a hole area HA is formed in a display area, but is not limited thereto. Hereinafter, for convenience of description, embodiments in which the coating target is the display device DD in which the hole area HA is formed in the display area will be mainly described.

The display device DD may include a substrate SUB, a polarizing member POL disposed on the substrate SUB, and a hole area HA formed in the polarizing member POL. In some embodiments, the substrate SUB may include polyimide or glass as a transparent material, but is not limited thereto. In some embodiments, the hole area HA may be defined or formed through the polarizing member POL, but is not limited thereto. In an embodiment, for example, the hole area HA may be defined or formed through the polarizing member POL and the substrate SUB. In some embodiments, the hole area HA may have a circular shape in a plan view, but is not limited thereto. Hereinafter, for convenience of description, embodiments in which the hole area HA has a circular shape in a plan view will be mainly described.

Although not illustrated in the drawing, the display device DD may include a small camera disposed in the hole area HA. The small camera may be zoomed in or zoomed out on the hole area HA. In such an embodiment, the small camera may move in the third direction DR3 on the hole area HA. Accordingly, since the hole area HA of the display device DD is desired to include an empty space to allow the small camera to move, a cured resin RS for preventing moisture permeation is desired to be coated only onto an edge of the hole area HA. A detailed description thereof will be provided below.

When the display device DD is disposed on the stage STG, a center HAC of the hole area HA of the display device DD and the first rotation axis RC of the stage rotating part 100 may not be aligned with each other. When the center HAC of the hole area HA of the display device DD is not aligned with the first rotation axis RC, process efficiency may decrease because the stage aligning part 200 is desired to be driven in real time to coat the liquid material sprayed from the nozzle portion NZ onto the hole area HA. On the other hand, when the liquid material sprayed from the nozzle portion NZ is coated onto the hole area HA while the stage STG and the display device DD seated on the stage STG are rotated by driving the stage rotating part 100 after aligning the center HAC of the hole area HA and the first rotation axis RC, the process is simplified and thus the process efficiency may be improved. Therefore, as illustrated in FIG. 11, the center HAC of the hole area HA of the display device DD and the first rotation axis RC may be aligned by driving the stage aligning part 200 as the second mode.

Referring to FIGS. 12 and 13, an embodiment of the coating device 1 may further include a monitoring camera CM inside the stage STG. In such an embodiment, the stage STG may further include a camera seating space CA defined or formed inside the stage STG, a holder HD that is disposed inside the camera seating space CA to hold the monitoring camera CM, the monitoring camera CM disposed on the holder HD, and a viewport VP that protects the monitoring camera CM from the outside.

The camera seating space CA and the hole area HA of the display device DD may overlap in the third direction DR3. In the camera seating space CA, the monitoring camera CM may move in the first direction DR1 through the holder HD to change a position thereof. In some embodiments, the camera seating space CA may have a wider width than the hole area HA of the display device DD seated on the stage STG, but is not limited thereto.

In some embodiments, the viewport VP may include a high-hardness transparent material including or made of polycarbonate ("PC") or quartz, but is not limited thereto.

In such an embodiment, as described above, the monitoring camera CM may monitor the coating process in real time without being interfered with by an external configuration, and may monitor the coating process in real time even if the stage STG is driven in the third mode and tilted.

In an embodiment, the liquid material sprayed from the nozzle portion NZ may be sprayed along a spraying path RSP in the third direction DR3 to be coated onto the hole area HA of the display device DD. When the stage aligning part 200 aligns the center HAC of the hole area HA of the display device DD with the first rotation axis RC by aligning the stage STG as the second mode, the spraying path RSP may be disposed at an edge of the hole area HA as illustrated in FIGS. 11 and 12. Detailed features of the process of coating the liquid material onto the hole area HA of the display device DD will be described later. In some embodiments, the liquid material sprayed from the nozzle portion NZ may be a cured resin RS, but is not limited thereto. Hereinafter, for convenience of description, embodiments in which the liquid material is a cured resin RS will be mainly described.

Referring to FIGS. 14 to 17, when the center HAC of the hole area HA of the display device DD is aligned with the first rotation axis RC, an embodiment of the coating device 1 may coat the cured resin RS onto the edge of the hole area HA by being driven in a fourth mode in which the stage rotating part 100 rotates about the first rotating axis RC.

Since the stage rotating part 100 rotates about the first rotation axis RC in the fourth mode, the stage aligning part 200, the stage STG, and the display device DD disposed on the stage rotating part 100 may rotate about the first rotation axis RC. Since the center HAC of the hole area HA of the display device DD and the first rotation axis RC are aligned with each other, the hole area HA may rotate in place in the fourth mode. While the stage aligning part 200, the stage STG, and the display device DD are rotated by being driven in the fourth mode, the nozzle portion NZ may coat the cured resin RS onto the hole area HA of the display device DD along the spraying path RSP. Accordingly, in such an embodiment, the coating device 1 may effectively coat the cured resin RS onto the edge of the hole area HA even with a relatively small number of rotations.

The cured resin RS may be sprayed onto the edge of the hole area HA to form a cured resin layer RSL surrounding the inside of the hole area HA, and one area of the hole area HA in which the cured resin layer RSL is not disposed may be an empty space VC in which the small camera may move in the third direction DR3 to be zoomed in or zoomed out as described above.

Hereinafter, an alternative embodiment of the coating process of the coating device 1 will be described.

Figure 18:
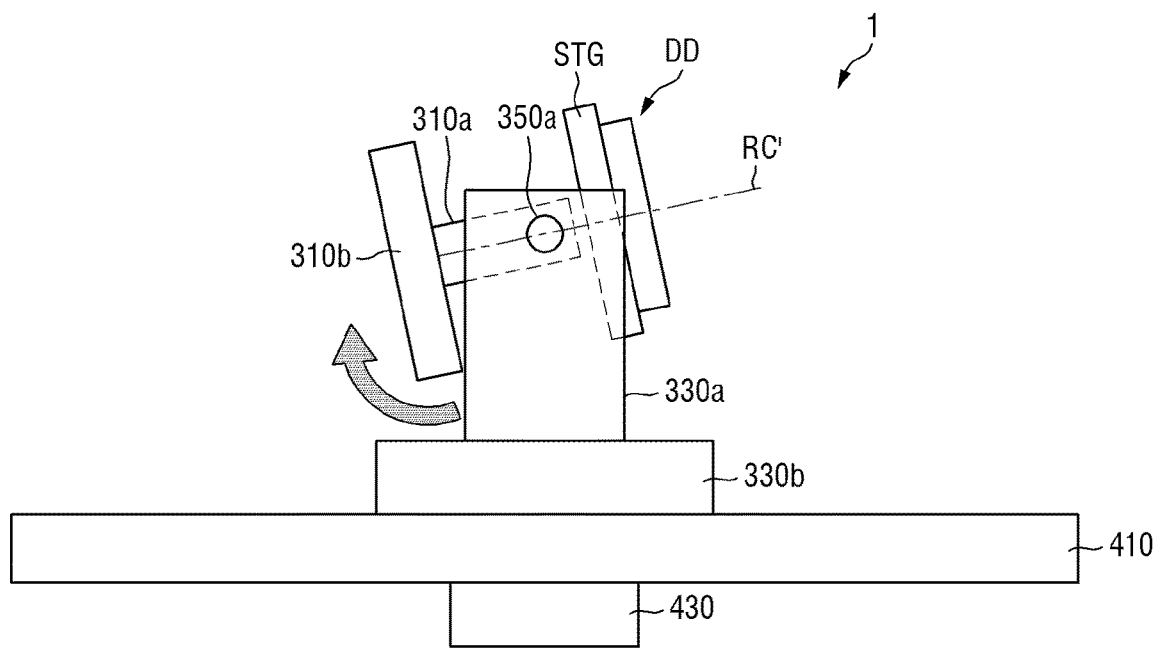
FIGS. 18 and 19 are views schematically illustrating an alternative embodiment of a process in which the coating device coats a liquid material onto a coating target.
Figure 19:
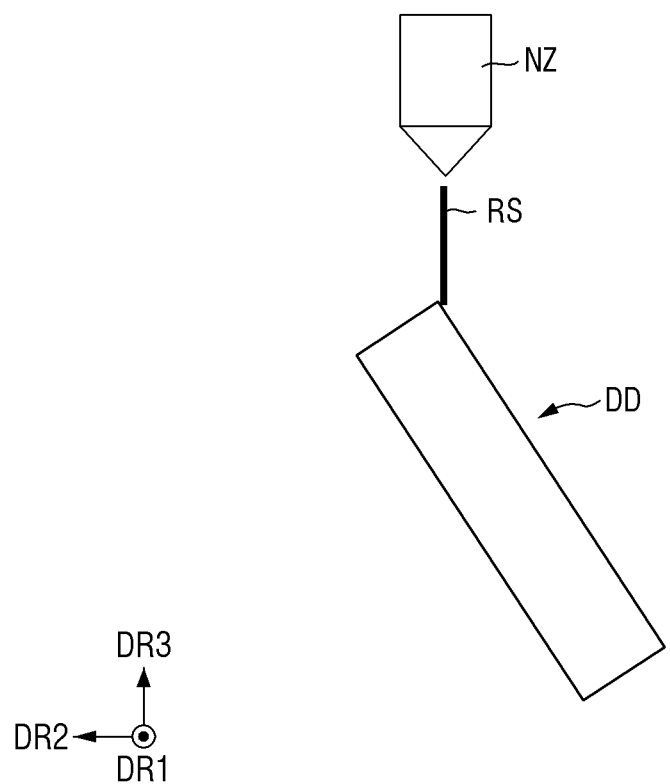
Figure 20:
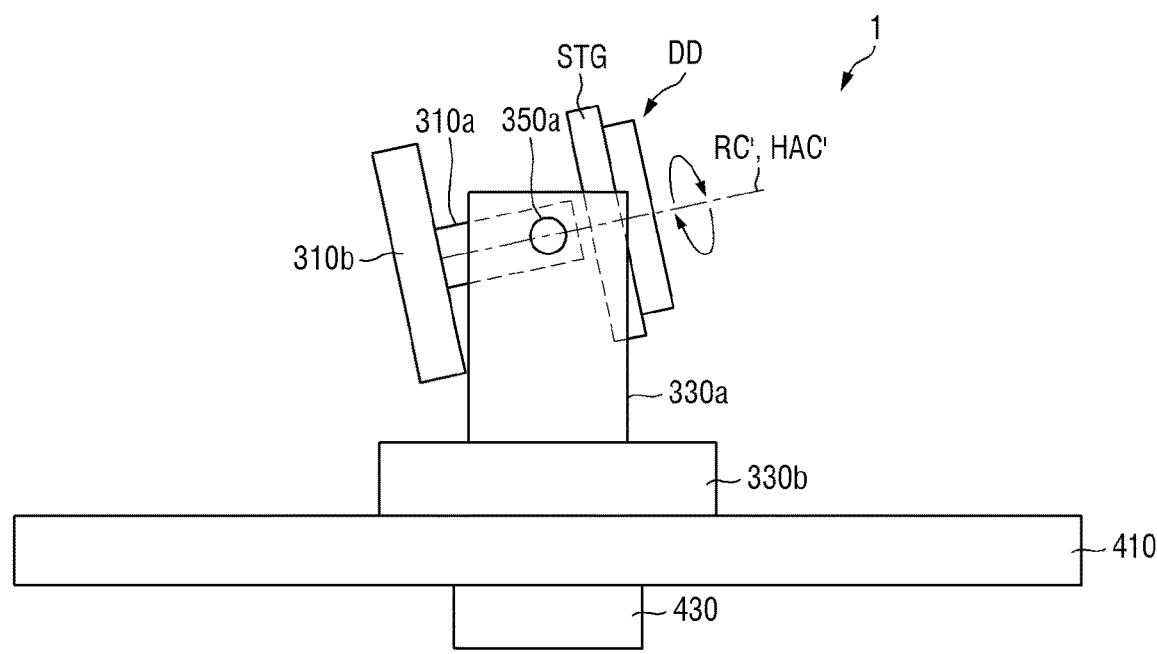
FIGS. 20 to 22 are views schematically illustrating another alternative embodiment of the process in which the coating device coats a droplet onto a coating target.
Figure 21:
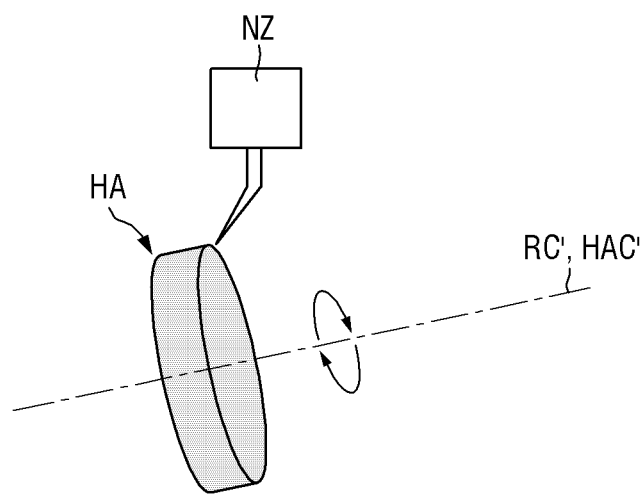
Figure 22:
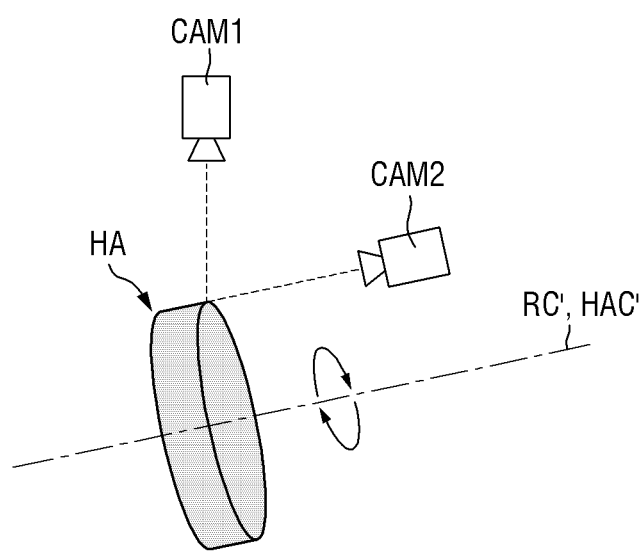

FIGS. 18 and 19 are views schematically illustrating an alternative embodiment of a process in which the coating device according to an embodiment coats a liquid material onto a coating target. FIGS. 20 to 22 are views schematically illustrating another alternative embodiment of the process in which the coating device coats a droplet onto a coating target.

Referring to FIGS. 18 and 19, an embodiment of the coating device 1 may be driven in the third mode to maintain a state in which the display device DD seated on the stage STG is tilted.

In such an embodiment, an edge of the display device DD may be positioned adjacent to the nozzle portion NZ. Accordingly, an embodiment of the coating device 1 may easily coat the cured resin RS onto the edge of the display device DD.

Referring to FIGS. 20 to 22, an embodiment of the coating device 1 may be driven in the third mode to maintain the state in which the display device DD seated on the stage STG is tilted, and may be driven in the fourth mode to rotate in the state in which the stage STG is tilted.

In such an embodiment, since the hole area HA of the display device DD is maintained in the tilted state and the first rotation axis RC is also tilted to correspond to the hole area HA (RC', HAC'; see FIGS. 21 and 22), the hole area HA may rotate in the tilted state as illustrated in FIGS. 21 and 22. Accordingly, in such an embodiment, the coating device 1 may effectively performed a coat process on the edge of the hole area HA of the display device DD, as show in FIG. 21. In such an embodiment, the coating device 1 may further include a plurality of monitoring cameras CAM1 and CAM2 and may easily evaluate whether the cured resin RS is sufficiently coated onto the edge of the hole area HA.

Hereinafter, an alternative embodiment of the coating device 1 will be described. In the following embodiments, the same components as those of the above-described embodiment will be denoted by the same reference numerals, and any repetitive detailed description thereof will be omitted or simplified and differences will be mainly described.

Figure 23:
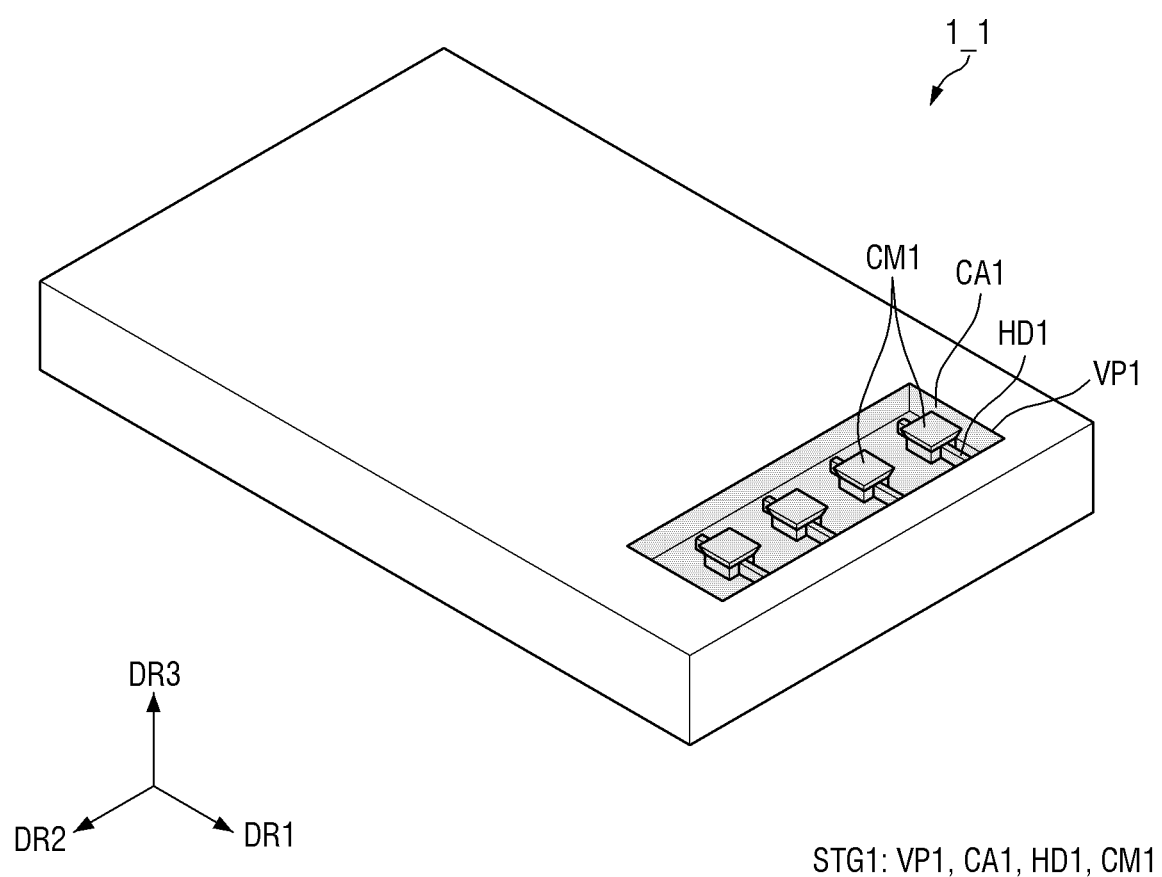
FIG. 23 is a perspective view schematically illustrating a stage of a coating device according to an alternative embodiment.

FIG. 23 is a perspective view schematically illustrating a stage of a coating device according to an alternative embodiment.

Referring to FIG. 23, in an alternative embodiment, a stage STG1 of a coating device 1_1 may be defined by an extended portion of a camera seating space CA1 in the second direction DR2. In such an embodiment, the stage STG1 may include a plurality of monitoring cameras CM1 and holders HD1 therein, and a viewport VP1 may have a rectangular shape having a long side in the second direction DR2 in a plan view, but is not limited thereto.

Accordingly, in such an embodiment, the coating device 1_1 has a wider area in which the coating process may be monitored, such that the coating process may be more effectively monitored.

Figure 24:
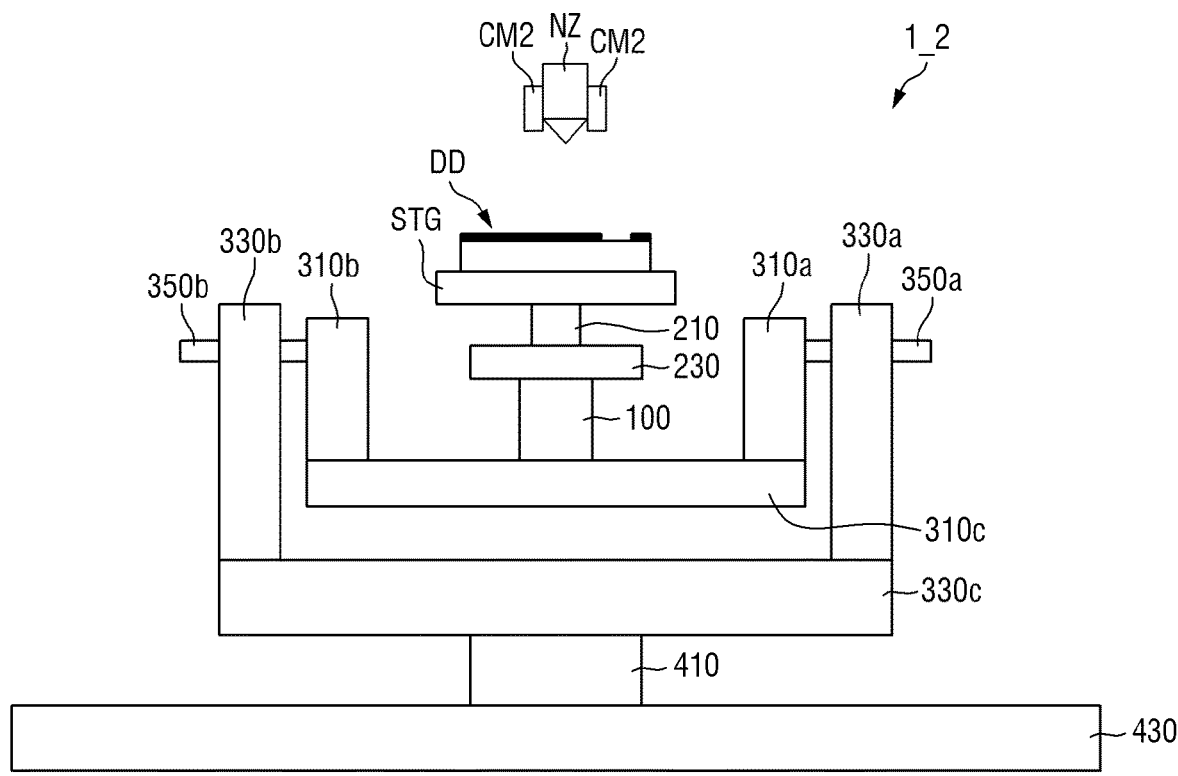
FIG. 24 is a plan view schematically illustrating a coating device according to an alternative embodiment.

FIG. 24 is a plan view schematically illustrating a coating device according to an alternative embodiment.

Referring to FIG. 24, in an alternative embodiment, a coating device 1_2 may have a monitoring camera CM2 disposed on the nozzle portion NZ. In some embodiments, the monitoring camera CM2 may be disposed on opposing sides of the nozzle portion NZ in the first direction DR1, but is not limited thereto.

Accordingly, an embodiment of the coating device 1_2 may monitor the coating process even when the substrate SUB of the display device DD is opaque.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A coating device comprising:
    a stage transfer part including a first long shaft extending in a first direction and a second long shaft extending in a second direction intersecting the first direction;
    a stage tilting part disposed on the stage transfer part, wherein the stage tiling part swings about a first swing axis;
    a stage rotating part disposed on the stage tilting part, wherein the stage rotating part rotates about a first rotating axis intersecting the first swing axis;
    a stage aligning part disposed on the stage rotating part, wherein the stage aligning part includes a first short shaft extending in the first direction and a second short shaft extending in the second direction; and
    a stage disposed on the stage aligning part, wherein a coating target is seated on the stage,
    wherein the stage includes a monitoring camera disposed in a camera seating space defined inside the stage,
    wherein the first swing axis is parallel to the first direction, and
    the first rotating axis is parallel to a third direction perpendicular to the first direction and the second direction.

2. The coating device of claim 1,
    wherein the stage transfer part moves the stage aligning part, the stage rotating part, and the stage to a process area in which a nozzle portion is disposed in a first mode, wherein the nozzle portion sprays a liquid material to the coating target.

3. The coating device of claim 2,
    wherein the stage aligning part aligns the stage and the coating target with the nozzle portion in a second mode.

4. The coating device of claim 3,
    wherein the stage tilting part swings about the first swing axis to tilt the stage rotating part, the stage aligning part, and the stage in a third mode.

5. The coating device of claim 4,
    wherein a width of the first long shaft in the first direction is greater than a width of the first short shaft in the first direction, and
    a width of the second long shaft in the second direction is greater than a width of the second short shaft in the second direction.

6. The coating device of claim 4,
    wherein the stage rotating part rotates the stage aligning part and the stage about the first rotating axis in a fourth mode.

7. The coating device of claim 6,
    wherein a hole area having a circular shape in a plan view is defined through the coating target,
    a center of the hole area overlaps the first rotating axis of the stage rotating part in the second mode, and
    the liquid material is coated onto the hole area by the nozzle portion in the third mode.

8. The coating device of claim 7,
    wherein the monitoring camera overlaps the hole area in the second mode.

9. The coating device of claim 7,
    wherein the nozzle portion coats the liquid material onto an edge of the hole area in the fourth mode.

10. The coating device of claim 4,
    wherein the nozzle portion coats the liquid material on an edge of the coating target in the third mode.

* * * * *